(12) United States Patent
Pillarisetty et al.

(10) Patent No.: US 9,048,266 B2
(45) Date of Patent: *Jun. 2, 2015

(54) APPARATUS AND METHODS FOR IMPROVING PARALLEL CONDUCTION IN A QUANTUM WELL DEVICE

(71) Applicant: INTEL CORPORATION, Santa Clara, CA (US)

(72) Inventors: Ravi Pillarisetty, Portland, OR (US); Mantu Hudait, Portland, OR (US); Been-Yih Jin, Lake Oswego, OR (US); Benjamin Chu-Kung, Hillsboro, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/956,685

(22) Filed: Aug. 1, 2013

(65) Prior Publication Data

US 2013/0313520 A1    Nov. 28, 2013

Related U.S. Application Data

(60) Continuation of application No. 13/545,358, filed on Jul. 10, 2012, now Pat. No. 8,525,151, which is a division of application No. 13/274,468, filed on Oct. 17, 2011, now Pat. No. 8,242,001, which is a division of application No. 12/381,832, filed on Mar. 16, 2009, now Pat. No. 8,080,820.

(51) Int. Cl.
*H01L 29/06* (2006.01)
*H01L 29/66* (2006.01)
*H01L 29/161* (2006.01)
*H01L 29/36* (2006.01)

(52) U.S. Cl.
CPC ........ *H01L 29/66977* (2013.01); *H01L 29/161* (2013.01); *H01L 29/365* (2013.01); *H01L 29/66439* (2013.01)

(58) Field of Classification Search
USPC ............... 257/14, 15, 18, 19, 20, E29.069
See application file for complete search history.

(56) References Cited

U.S. PATENT DOCUMENTS

| 5,284,782 A | 2/1994 | Jeong et al. |
| 5,288,582 A | 2/1994 | Contois et al. |

(Continued)

FOREIGN PATENT DOCUMENTS

| CN | 1070515 A | 3/1993 |
| CN | 1622336 A | 6/2005 |

(Continued)

OTHER PUBLICATIONS

Supplementary European Search Report received for European Patent Application No. 10753854.8, mailed on Nov. 12, 2014, 5 pages.

(Continued)

*Primary Examiner* — Roy Potter
*Assistant Examiner* — Paul Patton
(74) *Attorney, Agent, or Firm* — Winkle, PLLC

(57) ABSTRACT

Embodiments of an apparatus and methods of providing a quantum well device for improved parallel conduction are generally described herein. Other embodiments may be described and claimed.

6 Claims, 3 Drawing Sheets

(56) References Cited

U.S. PATENT DOCUMENTS

| | | | |
|---|---|---|---|
| 7,456,443 B2 * | 11/2008 | Saxler et al. | 257/194 |
| 7,485,536 B2 | 2/2009 | Jin et al. | |
| 7,915,642 B2 | 3/2011 | Pillarisetty et al. | |
| 8,080,820 B2 * | 12/2011 | Pillarisetty et al. | 257/14 |
| 8,525,151 B2 * | 9/2013 | Pillarisetty et al. | 257/14 |
| 2003/0080331 A1 | 5/2003 | Ono et al. | |
| 2005/0116218 A1 | 6/2005 | Yang | |
| 2005/0230705 A1 | 10/2005 | Taylor | |
| 2006/0284165 A1 | 12/2006 | Berger et al. | |
| 2007/0257301 A1 | 11/2007 | Allibert et al. | |
| 2008/0116485 A1 | 5/2008 | Hudait et al. | |
| 2008/0157058 A1 | 7/2008 | Hudait et al. | |
| 2008/0237573 A1 | 10/2008 | Jin et al. | |
| 2009/0072272 A1 * | 3/2009 | Suh et al. | 257/194 |
| 2010/0015753 A1 | 1/2010 | Garnett | |

FOREIGN PATENT DOCUMENTS

| | | |
|---|---|---|
| EP | 1 450 394 A1 | 8/2004 |
| JP | 2000-077652 A | 3/2000 |
| JP | 2003-133561 A | 5/2003 |
| JP | 2004-221363 A | 8/2004 |
| JP | 2008-103546 A | 5/2008 |
| WO | 2010/107571 A2 | 9/2010 |
| WO | 2010/107571 A3 | 1/2011 |

OTHER PUBLICATIONS

Office Action received for Taiwan Patent Application No. 099107078, mailed on Oct. 29, 2014, 5 pages of Office Action only.
Notice of Grant received for Chinese Patent Application No. 201080007045.1, mailed on Sep. 3, 2014, 2 Pages of Notice of Grant and 2 Pages of English Translation.
Fifth Office Action received for Chinese Patent Application No. 201080007045.1, mailed on Jun. 3, 2014, 4 Pages of Office Action and 6 Pages of English Translation.
Notice of Allowance received for Japanese Patent Application No. 2012-500818, mailed on Jan. 7, 2014, 2 Pages of Notice of Allowance only.
Office Action Received for Korean Patent Application No. 10-2011-7021450, Mailed on Dec. 12, 2012, 8 Pages of office action including 4 pages of English translation.
Office Action Received for Chinese Patent Application No. 201080007045.1, mailed on Jan. 25, 2013, 11 Pages of office action including 6 pages of English translation.
Office Action received for Chinese Patent Application No. 201080007045.1, mailed on Jun. 9, 2013, 12 pages of office action including 6 pages of English translation.
Office Action received for Japanese Patent Application No. 2012-500818 mailed on Jun. 4, 2013, 5 pages of office action including 3 pages of English Translation.
International Preliminary Report on Patentability Received for PCT Patent Application No. PCT/US2010/025845, Mailed on Sep. 29, 2011, 6 pages.
International Search Report and Written Opinion Received for PCT Patent Application No. PCT/US2010/025845, Mailed on Sep. 28, 2010, 8 pages.
Office Action received for Chinese Patent Application No. 201080007045.1, mailed on Nov. 29, 2013, 5 pages of Office Action and 6 pages of English Translation.
Office Action received for Chinese Patent Application No. 201080007045.1, mailed on Mar. 6, 2014, 4 pages of Chinese Office Action and 5 pages of English Translation.

* cited by examiner

APPARATUS AND METHODS FOR IMPROVING PARALLEL CONDUCTION IN A QUANTUM WELL DEVICE

RELATED APPLICATION

This application is a continuation of U.S. patent application Ser. No. 13/545,358, entitled "APPARATUS AND METHODS FOR IMPROVING PARALLEL CONDUCTION IN A QUANTUM WELL DEVICE," filed Jul. 10, 2012, which is a divisional of U.S. patent application Ser. No. 13/274,468, entitled "APPARATUS AND METHODS FOR IMPROVING PARALLEL CONDUCTION IN A QUANTUM WELL DEVICE," filed Oct. 17, 2011, now U.S. Pat. No. 8,242,001, issued Aug. 14, 2012, which is a divisional of U.S. patent application Ser. No. 12/381,832, entitled "APPARATUS AND METHODS FOR IMPROVING PARALLEL CONDUCTION IN A QUANTUM WELL DEVICE," filed Mar. 16, 2009, now U.S. Pat. No. 8,080,820, issued Dec. 20, 2011.

FIELD OF THE INVENTION

The field of invention relates generally to the field of semiconductor integrated circuit manufacturing and, more specifically but not exclusively, relates to quantum well structures with a P-N (positive-negative) junction superlattice to provide rectification of potential leakage current.

BACKGROUND INFORMATION

A variety of electronic and optoelectronic devices with quantum well transistors comprising epitaxially grown heterostructures, formed on substrates such as silicon, offer exceptionally high carrier mobility in the transistor channel. These devices provide exceptionally high drive current performance, enable lower power consumption and deliver higher speed logic applications. However, positive-type metal oxide semiconductors (PMOS) with quantum wells suffer low mobility in the transistor channel as compared to negative-type metal oxide semiconductors (NMOS) with quantum wells. Mobility of PMOS quantum wells can be enhanced by straining the quantum wells, but a corresponding drawback occurs in the form of increasing amounts of parallel conduction, leading to degradation in OFF-State leakage current.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
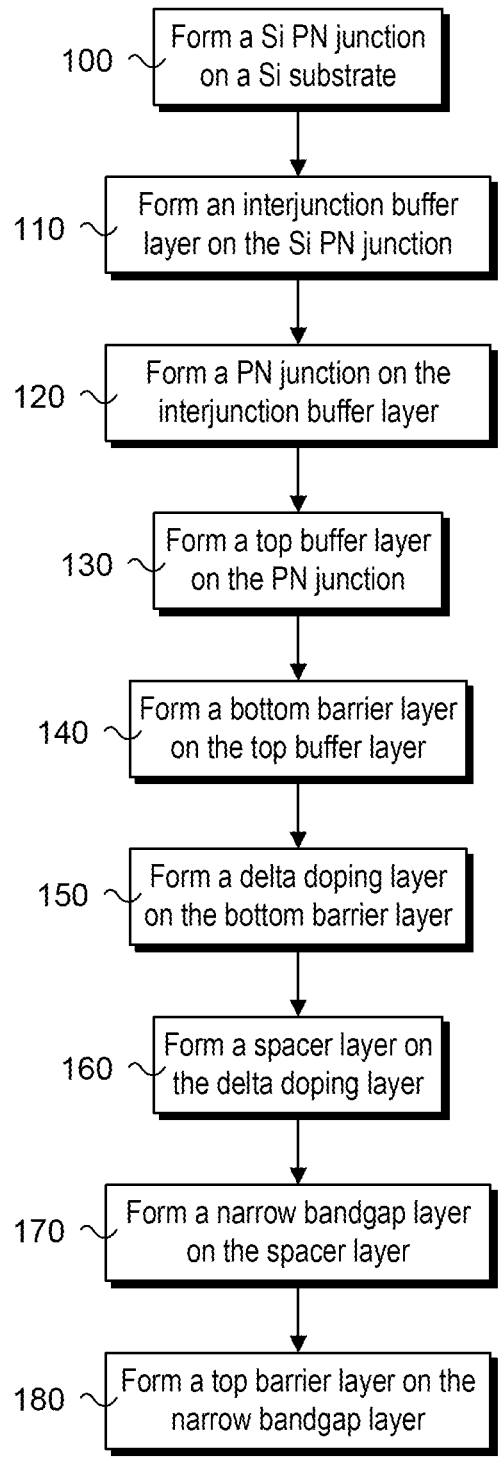
FIG. 1 is a flowchart describing one embodiment of a fabrication process used to form a quantum well structure with a P-N junction superlattice.

In various embodiments, an apparatus and methods for incorporating a P-N junction superlattice in a quantum well device are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Performance of planar and multi-gate transistors may be improved through implementation of epitaxially grown quantum wells comprising at least two materials with different bandgaps, where the quantum well is rectified using a P-N junction superlattice embedded in or adjacent to a buffer layer to effectively isolate the quantum well from a substrate. Preferably, the bandgap materials are formed from group IV elements such as silicon (Si) and germanium (Ge), however III-V and II-VI systems may also be used. A III-V system is a chemical compound consisting of elements with at least one group III element and at least one group V element. A II-VI system is a chemical compound consisting of elements with at least one group II element and at least one group VI element. An advantage to employing a P-N junction superlattice, comprising a plurality of P-N junctions, between the quantum well and the substrate is that use of a plurality of P-N junctions increases the probability that at least one of the P-N junctions will be defect free to electrically isolate the quantum well from the substrate.

It would be an advance in the art of semiconductor device manufacturing to fabricate quantum wells with a P-N junction superlattice in or adjacent to a buffer layer using a process flow compatible with conventional silicon-based manufacturing capabilities. Use of quantum wells with a P-N junction superlattice can offer a significant reduction in parallel conduction as compared to similar devices comprising quantum wells. For example, positively-doped metal oxide semiconductor (PMOS) devices with quantum wells typically suffer from low mobility unless the quantum well is strained. However, a PMOS device with strained quantum wells may suffer from significant amounts of parallel conduction, resulting in a significant leakage current through parasitic layers which can severely degrade OFF State leakage current.

Figure 2:
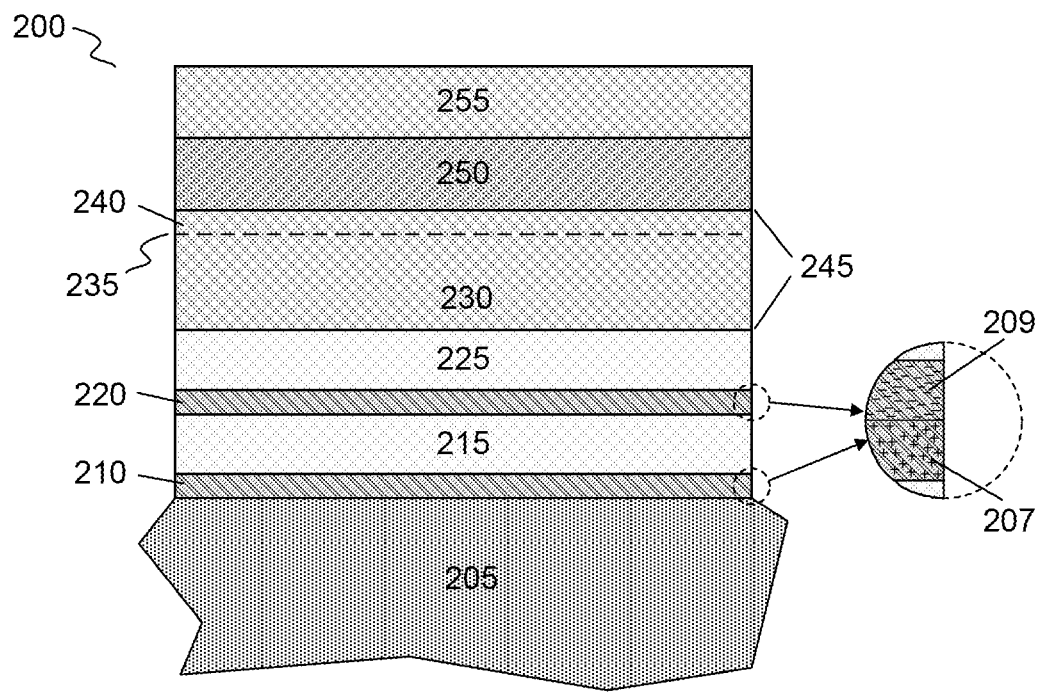
FIG. 2 is a cross-sectional view of a quantum well structure with a P-N junction superlattice on a substrate.

Embodiments for improving parallel conduction in a quantum well device are described in FIG. 1 in reference to the illustration in FIG. 2. Now turning to the figures, FIG. 1 is a flowchart describing an embodiment of a fabrication process used to form a quantum well structure with a P-N junction superlattice to provide a rectified quantum well structure 200 that may be embodied in a planar or non-planar quantum well device. In element 100, a silicon-based P-N junction is formed on a substrate. The silicon-based P-N junction corresponds to Si P-N junction 210 of the rectified quantum well structure 200 in FIG. 2.

The Si P-N junction 210, as well as other layers in the rectified quantum well structure 200, is formed on a substrate 205 using one or more of molecular beam epitaxy (MBE), liquid phase epitaxy (LPE), chemical vapor deposition (CVD), ultra high vacuum chemical vapor deposition (UH-CVD), metalorganic chemical vapor deposition (MOCVD), or atomic layer epitaxy (ALE) methods. Substrate 205 may preferably comprise bulk silicon and in some cases, a buried silicon-on-insulator substructure (not shown). Alternatively, the substrate 205 may comprise other materials—which may or may not be combined with silicon—such as: germanium, indium antimonide, lead telluride, indium arsenide, indium phosphide, gallium arsenide, or gallium antimonide. Although a few examples of materials from which substrate 205 may be formed are described here, any material that may serve as a foundation upon which a semiconductor device may be built falls within the spirit and scope of the present invention.

In this embodiment, the Si P-N junction 210 is formed on the substrate 205 with a positively-doped portion 207 of the Si P-N junction 210 grown on and directly adjacent to the substrate 205 and a negatively-doped portion 209 of the Si P-N junction 210 grown on and directly adjacent to the positively-doped portion 207. A thickness of the Si P-N junction 210 ranges approximately between 500 angstroms (Å) and 10,000 Å. The Si P-N junction 210 comprises silicon to provide a matching or closely matching crystal lattice at an interface between the substrate 205 and the Si P-N junction 210. The positively-doped portion 207 is typically silicon doped with boron to a concentration ranging between $5.0E16$ atoms/cm$^3$ and $1.0E19$ atoms/cm$^3$, or more preferably between $2.0E17$ atoms/cm$^3$ and $8.0E17$ atoms/cm$^3$. However in another embodiment the positively-doped portion 207 may be doped with another Group III element such as gallium (Ga) or indium (In). The negatively-doped portion 209 is typically silicon doped with phosphorus (P), arsenic (As), or antimony (Sb) to a concentration ranging between $1.0E16$ atoms/cm$^3$ and $1.0E19$ atoms/cm$^3$, or more preferably between $2.0E17$ atoms/cm$^3$ and $8.0E17$ atoms/cm$^3$.

In element 110 of FIG. 1 and illustrated in FIG. 2, an interjunction buffer layer 215 is formed on the Si P-N junction 210. Formation of the interjunction buffer layer 215 may be performed in-situ without exposing the Si P-N junction 210 to potential contaminants. In one embodiment, the interjunction buffer layer 215 is formed of a uniform layer of silicon germanium (SiGe) with a thickness sufficient to minimize or eliminate crystal lattice mismatch, ranging approximately between 1,000 Å to 10,000 Å. In another embodiment, the interjunction buffer layer 215 is formed of a graded layer of SiGe to provide a transition between the lattice sizing of the Si P-N junction 210 and a lattice sizing of an adjacently positioned SiGe P-N junction 220. The use of a graded layer of SiGe for the interjunction buffer layer 215 may reduce or eliminate defects in the SiGe P-N junction 220 due to crystal lattice mismatch to provide enhanced isolation from the substrate 205. In this embodiment, the interjunction buffer layer 215 is a continuously graded layer of SiGe with approximately 20 atomic weight % (at wt %) Ge concentration at the interface of the Si P-N junction 210 and up to approximately 80 at wt % Ge concentration at the interface of the SiGe P-N junction 220. In another embodiment, the interjunction buffer layer 215 is a step-graded layer of SiGe with relatively abrupt changes in Ge concentration along a thickness of the interjunction buffer layer 215 from a lower Ge concentration at the interface of the Si P-N junction 210 to a higher Ge concentration at the interface of the SiGe P-N junction 220.

The SiGe P-N junction 220 is formed on the interjunction buffer layer 215, as described in element 120 of FIG. 1, with a positively-doped portion 207 of the SiGe P-N junction 220 grown on and directly adjacent to the interjunction buffer layer 215 and a negatively-doped portion 209 of the SiGe P-N junction 220 grown on and directly adjacent to the positively-doped portion 207. Formation of the SiGe P-N junction 220 in combination with the Si P-N junction 210 creates a P-N junction superlattice. An application of a SiGe P-N junction is to diminish or prevent leakage current from reaching the interjunction buffer layer 215. Two P-N junctions are described in FIG. 1 and illustrated in FIG. 2, however, additional P-N junctions (not shown) may be added to provide a P-N junction superlattice that further enhances isolation from the substrate 205.

A thickness of the SiGe P-N junction 220 ranges approximately between 500 Å and 10,000 Å. The SiGe P-N junction 220 comprises a SiGe compound to provide a matching or closely matching crystal lattice at an interface between the SiGe P-N junction 220 and an adjacent layer, such as the SiGe buffer layer 225 illustrated in FIG. 2. The positively-doped portion 207 is typically SiGe doped with boron to a concentration ranging between $5.0E16$ atoms/cm$^3$ and $1.0E19$ atoms/cm$^3$, or more preferably between $2.0E17$ atoms/cm$^3$ and $8.0E17$ atoms/cm$^3$.

In element 130 of FIG. 1 and illustrated in FIG. 2, a top buffer layer is optionally formed on the SiGe P-N junction 220. In this embodiment, the top buffer layer is a SiGe buffer layer 225 comprising a concentration ranging between 40 at. wt. % and 80 at. wt. % of Ge, or more preferably between 65 at. wt. % and 75 at. wt. % of Ge. Formation of the SiGe P-N junction 220 may be performed in-situ without exposing the SiGe P-N junction 220 to potential contaminants. In one embodiment, the SiGe buffer layer 225 is formed of a uniform layer of silicon germanium (SiGe) with a thickness up to approximately 1,000 Å, though the embodiment is not so limited. In another embodiment, the SiGe buffer layer 225 is formed of a graded layer of SiGe to reduce or eliminate lattice defects at or near an interface between the SiGe buffer layer 225 and an adjacent layer.

In element 140 of FIG. 1 and illustrated in FIG. 2, a bottom barrier layer 230 is formed on the SiGe buffer layer 225. In this embodiment, the bottom barrier layer 230 is formed from a SiGe compound comprising a concentration of Ge ranging between 40 at. wt. % and 80 at. wt. %. The bottom barrier layer 230 is grown epitaxially to a thickness ranging between 10 nm to 50 nanometers (nm) or more preferably between 10 nm to 30 nm.

In element 150 of FIG. 1 and illustrated in FIG. 2, a delta doping layer 235 is formed on the bottom barrier layer 230. Formation of the delta doping layer 235 may be performed by suspending the epitaxial formation of bottom barrier layer 230 and exposing a surface of the bottom barrier layer 230 to a flux of elemental doping atoms or to a flux of a doping precursor. Formation of the delta doping layer 235 provides a well-defined and narrow dopant layer to provide a doping distribution that has a high peak concentration and a narrow distribution width as narrow as a single atomic layer. A thickness of the delta doping layer 235 may range between 5 Å to 300 Å and more preferably between 5 Å to 20 Å. Materials used to form the delta doping layer 235 may be boron (B), phosphorus (P), arsenic (As), and/or antimony (Sb).

Following formation of the delta doping layer 235, a spacer layer 240 is formed in element 160 of FIG. 1. The spacer layer 240 may comprise the same material used to form the bottom barrier layer 230, though the embodiment is not so limited. For example, the spacer layer 240 may be formed of a material likely to provide an improved lattice match with an overlying and adjacent layer. The spacer layer 240 may be formed by terminating the dopant source used to form the delta doping layer 235 and resuming the epitaxial growth used to form the bottom barrier layer 230. Formation of the spacer layer 240 in this manner substantially confines the doping atoms to the region of the delta doping layer 235. The stack of layers illustrated in FIG. 2 including the bottom barrier layer 230, delta doping layer 235 and the spacer layer 240 is a delta doped large bandgap stack 245.

In element 170 of FIG. 1, a quantum well layer comprising narrow bandgap material corresponding to a narrow bandgap layer 250 of FIG. 2 is formed on the spacer layer 240 with a narrow bandgap material formed adjacent to a large bandgap material. The narrow bandgap layer 250 is formed of Ge in this embodiment, though the embodiment is not so limited. The narrow bandgap layer 250 may alternately be formed of InSb or GaAs. A thickness of the narrow bandgap layer 250 ranges between 5 nm to 100 nm or more preferably between 20 nm to 40 nm.

In element 180 of FIG. 1, a top barrier layer 255 is optionally formed on the narrow bandgap layer 250. The top barrier layer 255 of FIG. 2 is formed of SiGe using an epitaxial process in one embodiment. However, the top barrier layer 255 may also be formed of another material with a relatively large bandgap, such as InAlAs, AlGaAs, AlInSb, and InP. A thickness of the top barrier layer 255 is selectively designed to provide desired barrier characteristics and may range between 10 nm to 60 nm or more preferably between 15 nm to 30 nm in one embodiment.

Figure 3:
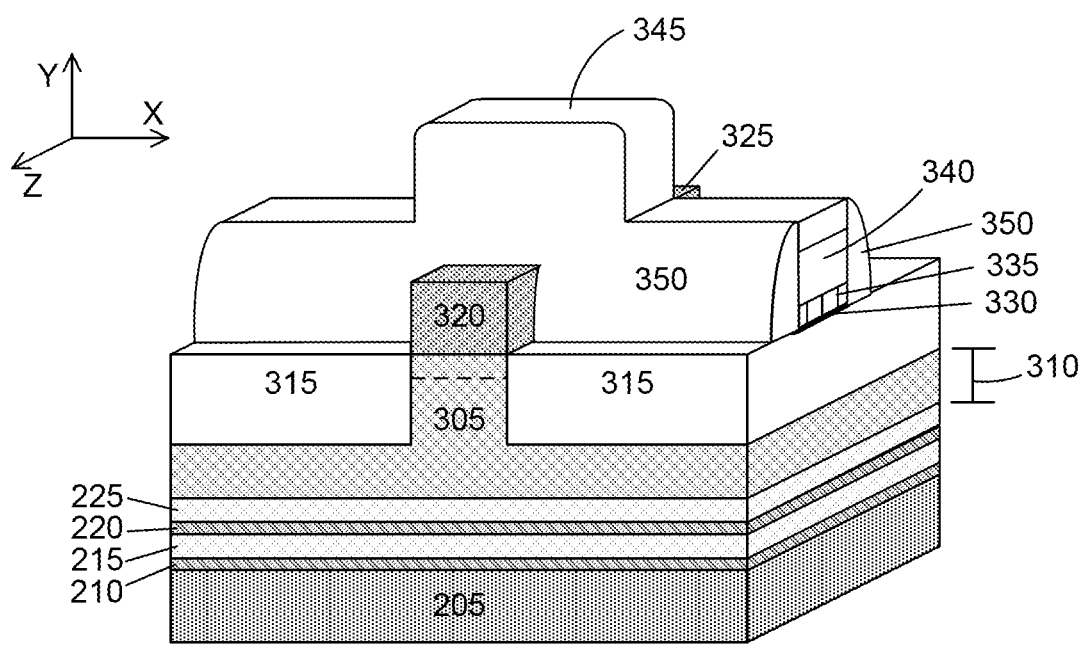
FIG. 3 is an isometric view of a non-planar quantum well device including a gate electrode and gate isolation spacers.

The rectified quantum well structure may be employed in a variety of embodiments, such as a modulation doped planar transistor (not shown) or non-planar transistor drawn along X, Y, and Z axes of a cartesian coordinate system as illustrated in FIG. 3. In this embodiment, the top barrier layer 255 of FIG. 2 is eroded to expose the narrow bandgap layer 250. The narrow bandgap layer 250 is exposed by etching the top barrier layer 255 using dry etch and/or wet etch techniques known to one skilled in the art. The particular dry etch and/or wet etch sequence provided is selective to etching the top barrier layer 255 without significantly disturbing the narrow bandgap layer 260.

The narrow bandgap layer 250 and a portion of the delta doped large bandgap stack 245 of FIG. 2 is patterned to form a multi-gate body 320, as illustrated in FIG. 3. The narrow bandgap layer 250 may be patterned using photolithography and etch techniques to create a tri-gate device structure with three gates of substantially the same length. In an alternate embodiment, the narrow bandgap layer 250 is patterned to create a narrow finFET structure with two gates of substantially the same length (not shown). The portion of the delta doped large bandgap stack 245 is also patterned to form recessed regions. In this embodiment, portions of the bottom barrier layer 230, the delta doping layer 235, and the spacer layer 240 of FIG. 2 are eroded to form a large bandgap structure 305 and to provide recesses for the formation of isolation regions 315 adjacent to the large bandgap structure 305. The large bandgap structure 305 may be formed by patterning the delta doped large bandgap stack 245 during the formation of a multi-gate body 320, which serves as an active region for the modulation doped non-planar transistor.

The large bandgap structure 305 is patterned to provide a large bandgap base thickness 310 wherein the large bandgap base thickness 310 may be nearly equal to the entire thickness of the large bandgap structure 305. Alternately, the large bandgap base thickness 310 may be zero, such that the isolation regions 315 are directly adjacent to the SiGe buffer layer 225. The isolation regions 315 may be formed of a dielectric material such as a silicon oxide, silicon nitride, silicon oxynitride, or a high-k dielectric material. Some of the materials that may be used to form isolation regions 315 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The isolation regions 315 may be formed using a conventional deposition method, e.g., a conventional chemical vapor deposition ("CVD"), low pressure CVD, or physical vapor deposition ("PVD") process. Preferably, a conventional atomic layer CVD process is used.

A multi-gate dielectric layer 330 is formed on the multi-gate body 320 and the isolation regions 315, the multi-gate dielectric layer 330 comprising at least one of silicon oxide or a high-K material. The high-K material comprises at least one of lanthanum oxide, tantalum oxide, titanium oxide, hafnium oxide, zirconium oxide, lead-zirconate-titanate, barium-strontium-titanate, or aluminum oxide. The multi-gate dielectric layer 330 is deposited as a conformal layer on the multi-gate body 320 using methods known to persons having ordinary skill in the art, such as plasma enhanced chemical vapor deposition (PECVD), high density chemical vapor deposition (HDCVD), molecular organic chemical vapor deposition (MOCVD), Atomic Layer Deposition (ALD), or sputtering.

A conformal workfunction metal layer 335 is fabricated at a desired thickness on the multi-gate dielectric layer 330. A workfunction metal is a metal with a known work function, which is an inherent characteristic of the metal expressed in units of electron volts (eV). In one embodiment, the workfunction metal layer 330 comprises at least one of titanium nitride, tantalum nitride, or another transition nitride metal. A workfunction metal layer thickness is a function of the targeted threshold voltage ($V_t$) for the multi-gate device. In one embodiment, the workfunction metal layer is formed using a directional sensitive physical vapor deposition (PVD) process.

A multi-gate electrode 340, such as polysilicon, and a hard mask 345 is fabricated on the workfunction metal layer 335. The multi-gate electrode 340 and the hard mask 345 are formed by a series of deposition, lithography, and etch processes known to one ordinarily skilled in the art. The multi-gate electrode 340 may be doped or un-doped and the hard mask 345 may comprise silicon nitride or silicon oxynitride. Gate isolation spacers 350 are formed to protect the multi-gate electrode 340, the workfunction metal layer 335, and the multi-gate dielectric layer 330 during subsequent processing. In this embodiment, the non-planar transistor of FIG. 3 is configured for improved parallel conduction by rectifying potential current caused by current flow leakage to the substrate 205. Application of the P-N junction superlattice comprising the Si P-N junction 210 and the SiGe P-N junction 220 can significantly reduce parallel conduction due to leakage current to the substrate 205.

Figure 4:
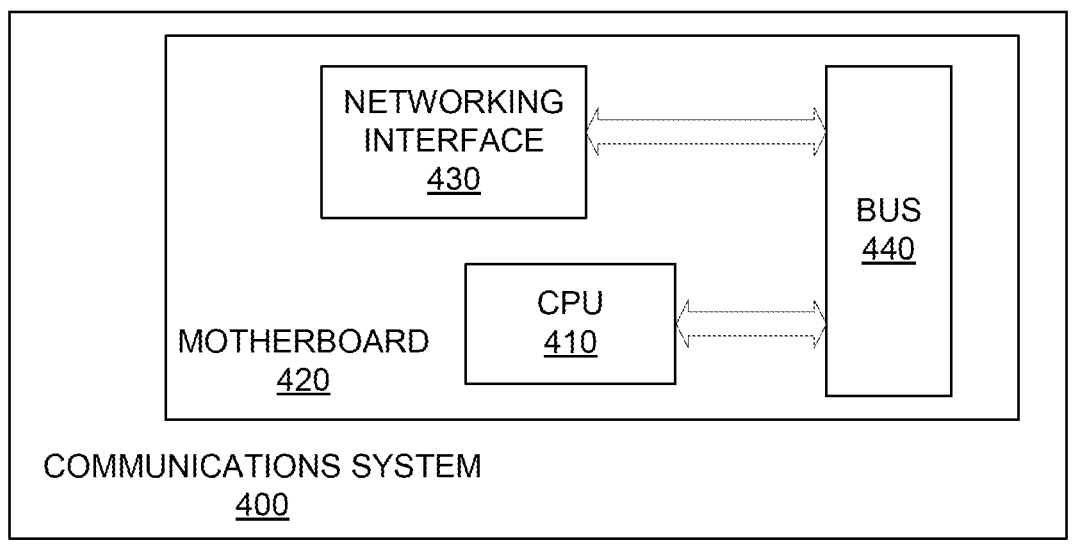
FIG. 4 illustrates a system with a central processing unit comprising modulation doped non-planar transistors.

FIG. 4 illustrates a system with a central processing unit comprising modulation doped planar and/or non-planar transistors. Here, a communications system 400 for processing data with a central processing unit (CPU) 410 comprising transistors with modulation doped non-planar transistors is illustrated in accordance with one embodiment. The communications system 400 may include a motherboard 420 with the CPU 410, and a networking interface 430 coupled to a bus 440. More specifically, the CPU 410 may comprise the earlier described modulation doped non-planar transistors and/or its method of fabrication. Depending on the applications, the communications system 400 may additionally include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described graded high germanium content silicon-germanium region and/or its method of fabrication. In various embodiments, communications system 400 may be a personal digital assistant (PDA), a mobile device, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A non-planar transistor, comprising:
   a substrate;
   a P-N junction superlattice on the substrate;
   a first buffer layer between a first P-N junction and a second P-N junction of the P-N junction superlattice;
   a second buffer layer on the second P-N junction;
   a delta doped large bandgap stack on the second buffer layer; and
   a multi-gate body on the delta doped large bandgap stack.

2. The non-planar transistor of claim 1, wherein the first P-N junction comprises silicon and the second P-N junction comprises germanium.

3. The non-planar transistor of claim 1, wherein the first P-N junction further comprises a negatively doped portion, the negatively doped portion is doped with a dopant selected from the group consisting of phosphorus (P), arsenic (As), and antimony (Sb).

4. The non-planar transistor of claim 1, further comprising a workfunction metal on the multi-gate body and an isolation region.

5. The non-planar transistor of claim 4, further comprising a multi-gate electrode on the workfunction metal.

6. The non-planar transistor of claim 5, wherein the multi-gate body comprises a concentration of Ge ranging between 40 and 80 atomic weight %.

* * * * *